US006251559B1

(12) United States Patent
Huang et al.

(10) Patent No.: US 6,251,559 B1
(45) Date of Patent: Jun. 26, 2001

(54) HEAT TREATMENT METHOD FOR OBTAINING IMAGABLE COATINGS AND IMAGABLE COATINGS

(75) Inventors: Jianbing Huang, Wood Ridge, NJ (US); Jerome Kesselman, Yorktown Heights, NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/368,261

(22) Filed: Aug. 3, 1999

(51) Int. Cl.[7] .......... G03F 7/004

(52) U.S. Cl. .......... 430/270.1; 430/5; 430/302; 430/494

(58) Field of Search .......... 430/270.1, 302, 430/494, 5

(56) References Cited

U.S. PATENT DOCUMENTS

| | | | |
|---|---|---|---|
| 4,708,925 | 11/1987 | Newman | 430/270 |
| 5,085,972 | 2/1992 | Vogel | 430/270 |
| 5,286,612 | 2/1994 | Telfer | 430/335 |
| 5,340,699 | 8/1994 | Haley et al. | 430/302 |
| 5,372,907 | 12/1994 | Haley et al. | 430/157 |
| 5,372,915 | 12/1994 | Haley et al. | 430/302 |
| 5,441,850 | 8/1995 | Marshall et al. | 430/336 |
| 5,466,557 | 11/1995 | Haley et al. | 430/278 |
| 5,491,046 | 2/1996 | Deboer et al. | 430/302 |

FOREIGN PATENT DOCUMENTS

| | | |
|---|---|---|
| 0652483 | 5/1995 | (EP) . |
| 0672954 | 9/1995 | (EP) . |
| 0819980 | 1/1998 | (EP) . |
| 0897134 | 2/1999 | (EP) . |
| 894622 | 2/1999 | (EP) . |
| 1245924 | 9/1971 | (GB) . |
| WO96/20429 | 7/1996 | (WO) . |
| WO97/39894 | 10/1997 | (WO) . |
| 9832608 | 7/1998 | (WO) . |
| WO99/01795 | 1/1999 | (WO) . |
| WO99/01796 | 1/1999 | (WO) . |
| WO99/08879 | 2/1999 | (WO) . |
| 9921715 | 5/1999 | (WO) . |
| WO99/21725 | 5/1999 | (WO) . |

*Primary Examiner*—Hoa Van Le
*Assistant Examiner*—Barbara Gilmore
(74) *Attorney, Agent, or Firm*—Baker Botts L.L.P.

(57) ABSTRACT

Imagable articles comprising positive working polymeric resins coating onto substrates are given a heat treatment comprising their controlled slow cooling from an elevated temperature. The imagable articles include precursors for lithographic printing plates and for printed circuits. The controlled slow cooling improves the development characteristics of the coatings after an imaging step.

31 Claims, 1 Drawing Sheet

Temperature Profile of the oven used in Example 1 after power-off

HEAT TREATMENT METHOD FOR OBTAINING IMAGABLE COATINGS AND IMAGABLE COATINGS

BACKGROUND OF INVENTION

This invention relates to methods of providing precursors for use in image-forming methods, for example to make lithographic printing forms or electronic parts, such as printed circuits. The invention relates further to such precursors per se, and to their use.

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water while the image area accepts ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which is meant a coated printing form—or plate—prior to exposure and development) has a radiation sensitive coating applied to an aluminium substrate. Negative working lithographic printing form precursors have a radiation sensitive coating which when imagewise exposed to radiation of a suitable wavelength hardens in the exposed areas. On development the non-exposed areas of the coated composition are removed leaving the image. In contrast, positive working lithographic printing form precursors have a radiation sensitive coating, which after imagewise exposure to radiation of a suitable wavelength becomes more soluble, in a developer, in the exposed areas than in the non-exposed areas. In both cases only the image area on the printing form itself is ink-receptive.

The differentiation between image and non-image areas is made in the exposure process where a film is applied to the printing form precursor with a vacuum to ensure good contact. The printing form precursor is then exposed to a radiation source; conventionally this has been a UV radiation source. In the case where a positive printing form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed on development.

The resists used in pattern forming methods for electronic parts such as printed circuits are also classified into two types: negative working and positive working. After exposure to radiation and development, the resist pattern is used as a mask for forming the patterns onto the underlying electronic elements—for example by etching an underlying copper foil. Due to the high resolution demands and the requirements of high resistance to etching techniques, positive-working systems are widely used. In particular, in the main there have been used alkali developable positive working resists mainly composed of alkali-soluble novolak resins.

The types of electronic parts whose manufacture may use a resist include printed wiring boards (PWBs), thick- and thin-film circuits, comprising passive elements such as resistors, capacitors and inductors; multichip devices (MDCs); and integrated circuits (ICs). These are all classified as printed circuits.

Imagable compositions may also be applied to masks. The required pattern is formed on the mask, which is then used as a screen in a later processing step, in forming a pattern on, for example, a printing or electronic part precursor.

Common to virtually all commercial applications of positive working systems employing UV radiation over several decades have been compositions comprising alkali soluble phenolic resins and naphthoquinone diazide (NQD) derivatives. The NQD derivatives have been simple NQD compounds used in admixture with resins, or NQD resin esters in which the photoactive NQD moiety has been chemically attached to the resin itself, for example by esterification of the resin with an NQD sulphonyl chloride.

As demands on the performance of UV sensitive positive working coatings have increased so NQD technology has become limiting. In addition, digital and laser imaging technology is making new demands on the coatings.

It is known from GB 1245924 that the solubility of phenolic resins in developers may be increased by the application of heat. The heat may be delivered by infra-red radiation, assisted by radiation absorbing components such as carbon black or Milori Blue (C.I. Pigment Blue 27). However the developer resistance of the non-exposed areas to commercial developers is low, and the solubility differential generated on application of heat is low compared to the commercial UV sensitive compositions containing NQD moieties.

U.S. Pat. No. 5,372,915 is an example of a printing form containing a radiation sensitive composition which is comprised of a resole resin, a novolak resin, a latent Bronsted acid and an infrared absorber. In the preparation of a lithographic printing form, the radiation sensitive composition is imagewise exposed to activating infrared radiation and the exposed areas of the printing form are removed with an aqueous alkaline developing solution. Related U.S. Pat. No. 5,340,699 discloses the preparation of a lithographic printing form using the same radiation sensitive composition as in U.S. Pat. No. 5,372,915. But in this related patent the radiation sensitive composition is imagewise exposed to activating radiation, and then the printing form is heated to provide reduced solubility in exposed areas and increased solubility in unexposed areas. The unexposed areas of the printing form are then removed with an aqueous alkaline developer. Although the composition is the same, a positive or a negative lithographic image is produced in accordance with each respective patent by varying the activating radiation and adding a blanket heating step.

Further examples of radiation sensitive compositions and their use in making lithographic printing forms are disclosed in U.S. Pat. Nos. 4,708,925; 5,085,972; 5,286,612; 5,441,850; 5,491,046; 5,340,699; 5,466,557; and 5,372,907; European patent application 672 954 A2; and WO 96/20429.

New positive working heat sensitive systems have been developed to meet the new demands, as exemplified by: WO 97/39894; WO 99/01796; WO 99/01795; WO 99/08879; and WO 99/21725. It has been observed that in these new systems there may be an alteration in their sensitivity over time, after the heat sensitive composition has been applied to a substrate and dried, such effect being the result of reduced developer solubility of the unexposed compositions with time prior to exposure. Thus when the term “sensitivity” is used herein, it is used in the context of the entire process of exposure and development, and is not referring to the matter of how the areas of the composition which are exposed react to that exposure. Sometimes this “sensitivity” is called “operating speed” in the lithographic printing art.

SUMMARY OF THE INVENTION

This invention includes a process which offers improvement of the new systems mentioned above, such that the products are more consistent and stable and/or show enhanced resistance to undesired developer attack in regions which have not been imaged. The invention may also be applied to other positive working compositions, for example those of the further specifications described above.

In accordance with a first aspect of the invention there is provided a method of providing a precursor which comprises an imagable coating on a substrate, the coating comprising a positive working polymeric composition, wherein the method includes a heat treatment step comprising the controlled slow cooling of the coated substrate from an elevated temperature to a lower temperature.

DETAILED DESCRIPTION OF THE INVENTION

Figure 1:
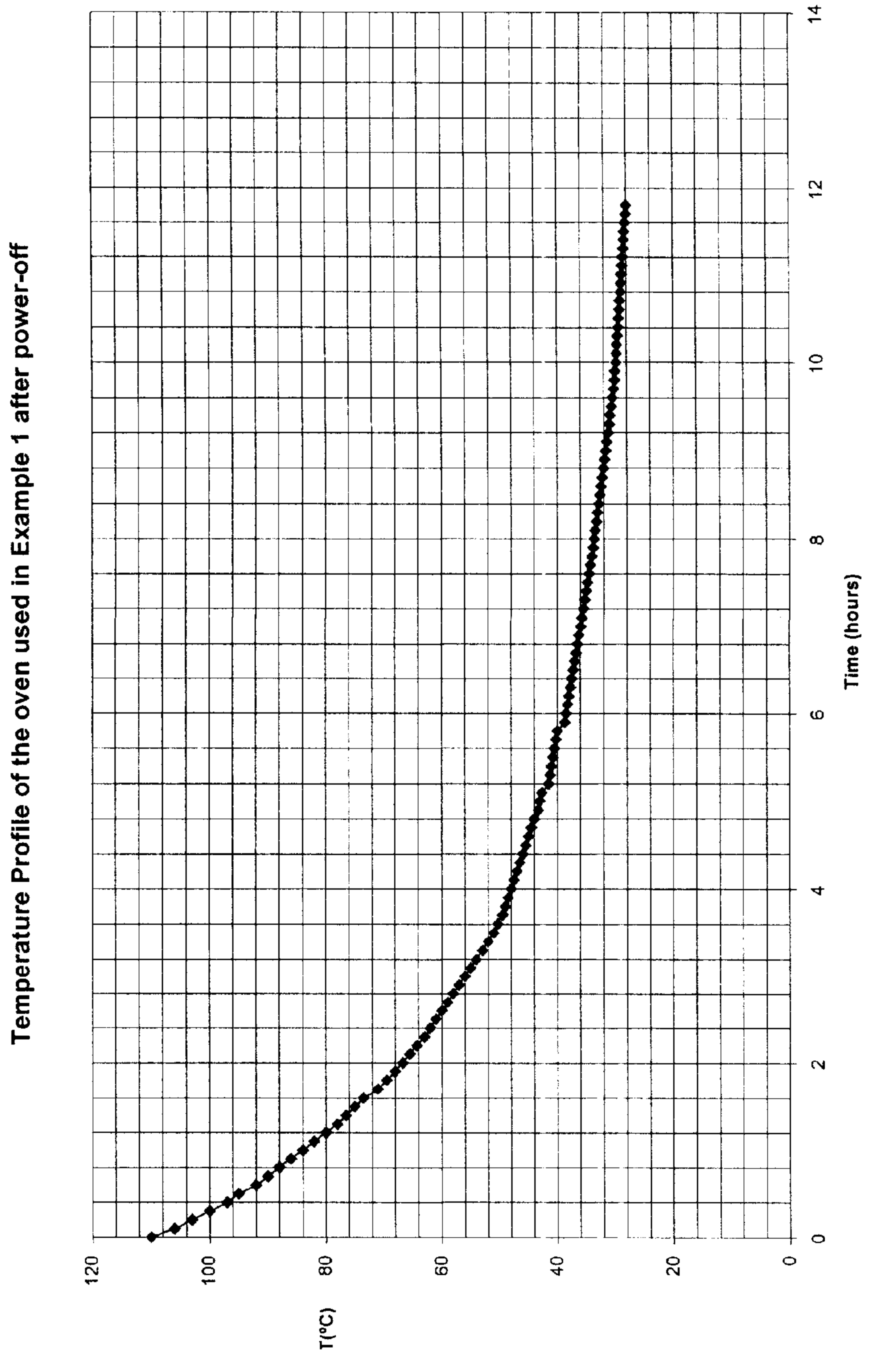
FIG. 1 sets forth the temperature profile of the oven used in Example 1 after power-off vs. Time (in hours).

It has been found that by carrying out a heat treatment step comprising said controlled slow cooling, the sensitivity of the composition may be rendered less variable, over time. Further, it has been found that the composition may be rendered more resistant to undesired attack by a developer in non-imaged regions. Without being bound by any theory, it is believed that the controlled slow cooling aids the formation of a stable network structure within the composition, and that this is a key factor in achieving both benefits mentioned above.

“Controlled slow cooling” in this specification means cooling under conditions such that heat is lost from the precursor more slowly than if it is cooled from the elevated temperature under ambient conditions, that is, in still air at ambient temperature, typically 20° C. For example, controlled slow cooling may be carried out by providing thermally insulating material around the precursor, preferably at the commencement of cooling, or by leaving it in an oven (or other heated space) in which it was subjected to such elevated temperature, the oven having been set to progressively lower temperatures or, preferably, simply having been turned off.

Optimal conditions to achieve the benefits will vary from case to case, and can readily be determined by trial and error. However, in general the elevated temperature is 40° C. or above, preferably 45° C. or above, most preferably 50° C. or above.

When a coil of coated substrate or a stack of coated substrates is to be heat treated it is preferred that the elevated temperature does not exceed the glass transition temperature (Tg) of the composition, in order to avoid adhesion between layers. Such embodiments are referred to herein as “lower temperature embodiments”. Preferably, in lower temperature embodiments, in particular when the composition comprises a phenolic resin, the elevated temperature is not in excess of 90° C., and preferably not in excess of 85° C., most preferably not in excess of 60° C. Adjacent “strata” of a stack or coil may be separated by interleaving material, for example paper or tissue, although this is not believed to be essential. “Controlled slow cooling” of a coil or stack means cooling under conditions such that heat is lost from the coil or stack more slowly than if the same coil or stack is cooled under ambient conditions.

In lower temperature embodiments employing a stack or coil, the stack or coil is preferably at the elevated temperature for an extended period, sufficient for the whole stack or coil to reach the elevated temperature and for each part of the stack or coil to have a hold period at the elevated temperature of at least 12 hours, preferably at least 24 hours. At the end of the extended period the controlled slow cooling takes place.

When precursors are to be heated individually or in a spaced-apart array, (not being in face-to-face contact or separated only by interleaving or material) the elevated temperature may exceed Tg of the composition, and an extended hold period is not needed at such a temperature. Such embodiments are referred to herein as “higher temperature embodiments”. Preferably in such embodiments, in particular when the composition comprises a phenolic resin, the elevated temperature is 90° C. or above, preferably 105° C. or above, most preferably 110° C. or above. However it must not be so high as to cause irreversible modification of the composition, such that it cannot later be imaged in the required manner. Preferably, therefore, the elevated temperature does not exceed 150° C., more preferably 140° C., especially 125° C.

Tg, as referenced in this specification, refers to Tg as measured by differential scanning calorimetry (DSC) at a heating rate of 10° C./minute.

Preferred compositions are those which after imaging are soluble in aqueous developers.

Many polymeric compositions show changes in their performance over time, and may be improved by the heat treatment step of the invention. Examples of polymers which could be present in the composition include polyurethanes, phenolic resins, poly(hydroxystyrenes) and polyacrylic resins, as homopolymers, copolymers or terpolymers. Preferably the polymeric composition includes a polymer having hydroxyl groups. Preferably the composition contains at least 20%, more preferably at least 50%, most preferably at least 70%, of such a resin, or of such resins in total, by weight on total weight of the composition.

Particularly useful phenolic resins in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. Dependent on the preparation route for the condensation a range of phenolic materials with varying structures and properties can be formed. Particularly useful in this invention are novolak resins, resole resins and novolak/resole resin mixtures. Most preferred are novolak resins. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare novolak resins.

Examples of suitable novolak resins have the following general structure

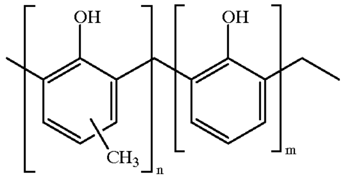

Other polymers suitable for inclusion in the composition, notably in admixture with a phenolic, preferably novolak, resin, include: poly-4-hydroxystyrene; copolymers of 4-hydroxystyrene, for example with 3-methyl-4-hydroxystyrene or 4-methoxystyrene; copolymers of (meth) acrylic acid, for example with styrene; copolymers of maleimide, for example with styrene; hydroxy or carboxy functionalised celluloses; dialkylmaleiimide esters; copolymers of maleic anhydride, for example with styrene; and partially hydrolysed polymers of maleic anhydride.

The Tg of typical compositions containing novolak resins is about 90–110° C. depending on the novolak resins selected, on their amount by weight in the composition, and on other components of the composition.

In lower temperature embodiments said lower temperature is preferably 30° C. or less, and is suitably ambient temperature.

In higher temperature embodiments, suitably the lower temperature is 60° C. or less, preferably 55° C. or less, more preferably 50° C. or less, especially 40° C. or less. Conveniently, it could be ambient temperature but it is believed that the benefits of the invention are generally achieved in full if the lower temperature is 45° C.±5° C. That is, providing controlled slow cooling to still lower temperatures does not appear to give further benefit, in higher temperature embodiments If the controlled slow cooling is only down to a higher temperature, say 65° C., substantial benefit is still likely to be achieved, but is normally not the maximum possible, that being achieved by controlled slow cooling down to, in general, a temperature of 40–50° C. It does not appear to matter if plates are placed thereafter in ambient air.

Suitably in the method of the invention the time for cooling the whole of a given precursor, in a stack or coil or in a spaced-apart array or singly, from the elevated temperature to the lower temperature ("the cooling period") is longer than the time the whole of a corresponding precursor (i.e. likewise in a stack or coil or in a spaced-apart array or singly) would take to cool from the elevated temperature to the lower temperature under ambient conditions; and preferably at least twice as long.

Suitably the cooling period for a given precursor of the invention, whether part of a stack or coil or in a spaced-apart array or singly, is at least 1 hour, preferably at least 2 hours, more preferably at least 3 hours, most preferably at least 4 hours, especially at least 6 hours. In determining hold periods and cooling periods of precursors in the form of a stack or coil the skilled person will take into account the thermal inertia of the stack or coil. Precursors which are obtained from an outer region of a coil or stack may, in effect, have had a longer hold period at the elevated temperature and a shorter cooling period, and precursors which are obtained from an inner region may, in effect, have had a shorter hold period and a longer cooling period. Conditions should be selected to ensure that the whole of all of the precursors have undergone a heat treatment in accordance with the invention to obtain good stability and resistance to developer attack in non-imaged regions.

Suitably for a given precursor the mean cooling rate of the fastest cooling part of the precursor over the cooling period is not greater than 1° C./min., preferably not greater than 0.5° C./min., more preferably not greater than 0.3° C./min., most preferably not greater than 0.2° C./min.

It will be appreciated that a primary object of the invention is to render the sensitivity (as previously defined) of the composition less variable over time. This is suitably assessed over a period of time which is the longest interval likely, between the manufacture of the precursor, and the use of the precursor by a customer. One year is regarded as being a suitable period of time, for this assessment. In absolute terms, preferably the heat treatment is such that the sensitivity reduction in a given developer over a one-year period after the heat treatment does not exceed 15%; and preferably does not exceed 10%. The invention has the further, and al lied, benefit, obtained immediately after the slow cooling step has been carried out, that the composition is rendered more developer resistant prior to imaging and, after imaging, in non-imaged areas. This leads to a way of assessing the effectiveness of the heat treatment immediately thereafter: desirably it causes a substantial increase in the time required to dissolve the non-imaged composition in a developer. By substantial increase we mean at least 50% longer, preferably at least 100% longer, more preferably at least 200% longer. In practice, increases of 300% or more can be achieved by methods of the invention, compared with corresponding compositions which have not undergone slow cooling, but instead normal cooling in ambient air The reference developer for those preferred embodiments requiring an aqueous developer is a 14 wt. % solution of sodium metasilicate in water, and that the reference temperature is 20° C. That is not to say that such a developer and temperature must be used in practical imaging and development methods applied by customers. It is believed this test, which looks at a property which is itself of importance, is also a usefull inferential test as regards stability over time; in other words, that precursors which perform well in this test are likely to perform well over time.

Preferably the controlled slow cooling is sufficiently slow that the developer solubility of the non-imaged composition is at or near (suitably within 10% of) the minimum which can be achieved by the method, for that composition; it has been found that there is a minimum solubility of the non-imaged composition, which the method can achieve for a given composition, and that further improvement is not achieved by cooling the composition even more slowly.

A further object of the present invention is that the sensitivity of the preferred compositions should be at a practicable level, after the heat treatment; suitably no more than 600 $mJcm^{-2}$, preferably no more than 400 $mJcm^{-2}$, most preferably no more than 250 $mJcm^{-2}$, and especially no more than 200 $mJcm^{-2}$.

Preferably the method includes the step of the application of the composition in liquid form, suitably in a solvent, to the substrate and the drying of the composition. In such embodiments the step of drying the composition may serve as the step of subjecting the precursor to the above-described elevated temperature, and such embodiments are suitably on-line methods in which the substrate is coated, then heated to effect drying at the elevated temperature, then subjected to the slow cooling step. In other, preferred, embodiments drying the composition and subjecting the precursor to the elevated temperature are steps distinct from each other. In these preferred embodiments the dried precursor, which may be conventionally cooled after drying, is heated to the elevated temperature, preferably held there for a hold period, and then subjected to the controlled slow cooling. Such embodiments are suitably off-line methods, especially usefull when a stack of precursors or a wound coil is to be heat-treated at a temperature not exceeding Tg of the composition.

The invention may also be employed to refresh or restore precursors which have, perhaps because of over-long storage or non-optimal storage or transport conditions, become unsuitable for use. They may be heated to the elevated temperature and subjected to the controlled slow cooling of the present invention, and thereby may be rendered indistinguishable from precursors which have been subjected to the present invention shortly after application of the composition, to form the precursor.

The term "method of providing a precursor" as used herein is therefore intended to cover a method of refreshing or restoring a precursor which has "gone off", and a method of manufacturing a precursor, in which the heat treatment step is part of the initial manufacturing method. The latter is a preferred method of the invention.

The time and temperature conditions for the controlled slow cooling step may be contrasted with the time and temperature conditions for a drying step. The slow cooling step preferably employs a longer time than the drying step. In the drying step the aim is to "flash dry" the composition. The time may typically be 15–600 seconds, especially 25–250 seconds and the temperature may typically be at least 70° C., suitably 80–150° C., especially 90–140° C. If the d step also serves as the hold step the time and temperature conditions may be as described above in relation to the hold step. The drying step should be carried out until the coating is self-supporting and dry to the touch. However it is not necessary (and may not even be possible) to remove all the solvent, in the drying step (or in the later hold step, if separate), or in the later slow cooling step.

The composition is preferably such that it is pattern wise solubilized by heat, during the pattern forming (exposure) process. In broad terms there are three ways in which heat can be patternwise delivered to the composition, in use. These are:

Direct heat, by which we mean the direct delivery of heat by a heated body, by conduction. For example the composition may be contacted by a heat stylus; or the reverse face of the substrate onto which the composition has been coated may be contacted by a heated body. A heated body may be a heat stylus.

The use of incident electromagnetic radiation to expose the composition, the electromagnetic radiation being converted to heat, either directly or by a chemical reaction undergone by a component of the composition. The electromagnetic radiation could for example be infra-red, or UV or visible radiation, depending on the composition. Preferably it is infra-red.

The use of charged-particle radiation, for example electron beam radiation. Clearly, at the fundamental level the charged-particle mode and the electromagnetic mode are convergent; but the distinction is clear at the practical level.

The time and temperature conditions for the heat treatment of the invention, carried out as part of the method of manufacturing a precursor, or of refreshing or restoring a precursor, may also be contrasted with the delivery of heat during the later exposure process, for those preferred compositions which are heat sensitive, the latter delivery of heat being of very short duration and very high intensity.

In patternwise exposing the precursor the use of electromagnetic radiation is preferred.

In order to increase the sensitivity of the preferred heat sensitive compositions used in the present invention it is beneficial in embodiments intended for exposure using electromagnetic radiation to include an additional component, namely a radiation absorbing compound capable of absorbing the incident electromagnetic radiation and converting it to heat (hereinafter called a "radiation absorbing compound"). It may also be desirable to include a suitable radiation-absorbing compound in embodiments intended for exposure using charged particle radiation.

In preferred compositions intended to require electromagnetic radiation for exposure, the composition may be such that it can be exposed by means of a laser under digital control. Preferably, such a laser emits radiation at above 450 nm, preferably above 500 nm, more preferably above 600 nm, and especially above 700 nm. Most preferably it emits radiation at above 800 nm. Suitably it emits radiation of wavelength below 1400 nm, preferably below 1300 nm, more preferably below 1200 nm.

Examples of lasers which can be used to expose compositions suitable for the method of the present invention include semiconductor diode lasers emitting at between 450 nm and 1400 nm, especially between 600 nm and 1200 nm. One example is the Nd YAG laser which emits at 1064 nm and another is the diode laser used in the CREO TRENDSETTER thermal image setter, which emits at 830 nm, but any laser of sufficient imaging power and whose radiation is absorbed by the composition to produce heat, can be used.

Preferably the radiation absorbing compound is one whose absorption spectrum is such that absorption is significant at the wavelength output of the radiation source, preferably laser, which is to be used in the patternwise exposure of precursors made by the method of the present invention. Usefully it may be an organic pigment or dye. It may be a black body radiation absorber, such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich. It may be a dye or pigment of the squarylium, merocyanine, phthalocyanine, cyanine, indolizine, pyrylium or metal dithioline classes.

In preferred compositions intended to require infra-red radiation for patternwise exposure it is preferred that their developer solubility is not increased by incident UV or visible radiation, thereby making handling of the compositions straightforward. Preferably such compositions do not comprise any UV or visible light sensitive components. However UV or visible light sensitive components which are not activated by UV or visible light due to the presence of other components, such as UV or visible light absorbing dyes or a UV or visible light absorbing topmost layer, may be present in such compositions.

Pigments are generally insoluble in the compositions and so comprise particles therein. Generally they are broad band absorbers, preferably able efficiently to absorb electromagnetic radiation and convert it to heat over a range of wavelengths exceeding 200 nm in width, preferably exceeding 400 nm in width. Generally they are not decomposed by the radiation. Generally they have no or insignificant effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm in width, and so have to be selected having regard to the wavelength of the radiation which is to be used for imaging.

Suitably the radiation absorbing compound, when present, constitutes at least 0.25%, preferably at least 0.5%, more preferably at least 1%, most preferably at least 2%, preferably up to 25%, more preferably up to 20%, most preferably up to 15%, of the total weight of the composition. A preferred weight range for the radiation absorbing compound may be expressed as 0.25–25% of the total weight of the composition. More specifically, in the case of dyes the range may preferably be 0.25–15% of the total weight of the composition, preferably 0.5–8%, while in the case of pigments the range may preferably be 1–25%, preferably 2–15%. For pigments, 5–15% may be especially suitable. In each case the figures given are as a percentage of the total weight of the dried composition. There may be more than one radiation-absorbing compound. References herein to the proportion of such compound(s) are to their total content.

A preferred, heat sensitive, composition preferably includes a modifying means for modifying the properties of the composition. Such a modifying means is preferably arranged to alter the developer solubility of the composition compared to when the modifying means is not present in the composition. The modifying means may be covalently bonded to a polymer of the composition or may be a compound which is not covalently bonded thereto.

The modifying means may be selected from:

Functional groups as described in WO 99/01795, which is incorporated herein by reference.

Diazide moieties described in WO 99/01796, which is incorporated herein by reference.

Separate compounds, not being diazide moieties, and described in WO 97/39894, WO 99/08879 and WO 99/21725, all of which are incorporated herein by reference Examples described include nitrogen-containing compounds wherein at least one nitrogen atom is either quatemized or incorporated in a heterocyclic ring; or quaternized and incorporated in a heterocyclic ring. Examples of useful quartemized nitrogen containing compounds are triaryl methane dyes such as Crystal Violet (CI basic violet 3) and Ethyl Violet. WO 97/01796 describes lithographic printing applications and WO 99/08879 describes electronic part applications of this technology. WO 99/21725 describes improvements to this technology brought about by the use of certain developer resistance aids, notably siloxane compounds.

Latent Bronsted acids, onium salts or acid generating compounds as described in patents mentioned above, for example U.S. Pat. No. 5,491,046, U.S. Pat. No. 4,708,925 and EP 819980, all of which are incorporated herein by reference.

The preferred embodiments of the present invention involve the heat treatment of compositions which do not contain diazide moieties.

The present invention may be applied with benefit to precursors with a wide range of compositions; but particularly to such compositions for which patternwise exposure entails the delivery of heat to selected areas of the precursor; and especially to such compositions for which delivery of heat causes the solubility change not by irreversible chemical decomposition. In preferred compositions to which the present invention is applied heat imaging produces areas which have transient increased solubility in the developer. After an interval such areas may partially or wholly revert to their original, non-imaged level of solubility. Thus the mode of action of such preferred compositions does not require heat-induced lysis of the reversible insoluble means but, more likely, the break-up of a physico-chemical complex, which can re-form. Consequently, in such preferred embodiments the precursor is contacted with a developer within a time period of 20 hours or less of the exposure to imaging heat, preferably within about 120 minutes of exposure, and most preferably immediately after exposure.

A preferred composition to which the method of the present invention may advantageously be applied contains a reversible insolubilizer compound and, preferably, an infra-red absorbing compound; or a compound which functions as a reversible insolubilizer compound and as an infra-red absorbing compound. Examples are given in WO 97/39894, WO 99/08879 and WO 99/21725. Indeed, the compositions and precursors described in WO 97/39894, WO 99/08879 and WO 99/21725 are preferred compositions and precursors to which the present invention can be applied.

Suitably a reversible insolubilizer compound, when present (whether or not also acting as a radiation absorbing compound) constitutes at least 1%, preferably at least 2%, preferably up to 15%, more preferably up to 25% of the total weight of the composition.

An especially preferred composition to which the present invention can be applied thus comprises a composition as defined above, and, additionally, either an infra-red absorbing compound to convert infra-red radiation to heat and a said reversible insolubilizer compound as described in WO 97/39894 and WO 99/08879; or an infra-red absorbing compound which converts infra-red radiation to heat and which also functions as a reversible insolubilizer compound. Suitably it additionally contains a developer resistance means as defined in WO 99/21725, suitably a siloxane, preferably constituting 1–10 wt.% of the composition. Preferred siloxanes are substituted by one or more optionally-substituted alkyl or phenyl groups, and most preferably are phenylalkylsiloxanes and dialkylsiloxanes. Preferred siloxanes have between 10 and 100 $—Si(R^1)(R^2)O—$ repeat units. The siloxanes may be copolymerised with ethylene oxide and/or propylene oxide. For further information on preferred siloxanes the definitions in WO 99/21725 may be recited.

The compositions used in the invention may contain other ingredients such as stabilising additives, inert colorants, and additional inert polymeric binders as are present in many positive working compositions.

In certain embodiments of the invention an additional layer comprising a radiation-absorbing compound can be used. This multiple layer construction can provide routes to high sensitivity as larger quantities of absorber can be used without affecting the function of the image-forming layer. In principle any radiation absorbing material which absorbs sufficiently strongly in the desired band can be incorporated or fabricated in a uniform coating. Dyes, metals and pigments (including metal oxides) may be used in the form of vapour deposited layers. Techniques for the formation and use of such films are well known in the art, for example as described in EP-A-652483, incorporated herein by reference.

The precursor includes a substrate over which the composition is provided.

The substrate may comprise a metal layer. Preferred metals include aluminium, zinc, copper and titanium.

The substrate in embodiments of the invention intended as printing form precursors may be arranged to be non-ink-accepting. The substrate may have a hydrophilic surface for use in conventional lithographic printing using a fount solution or it may have a release surface suitable for use in waterless printing.

The substrate may be any type of substrate usable in printing. For example, it may comprise a cylinder or, preferably, a plate.

For printing applications the substrate may be aluminium which has undergone the usual anodic, graining and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephthlate which has been treated to render its surface hydrophilic. Also a so-called coated paper which has been corona discharge treated can be used.

Preferred printing forms have a substrate which has a hydrophilic surface and an oleophilic ink-accepting composition.

For electronic part applications the substrate may be a copper plate. After imaging and development an etching agent may be used to remove exposed metal regions, leaving, for example, a printed circuit.

For mask applications the substrate may be a plastics film.

In the specification when it is stated that a composition is developer soluble it is intended that it is soluble in a selected developer, to an extent useful in a practical development process. When it is stated that a composition is developer insoluble it is intended that it is not soluble in the selected developer, to an extent useful in a practical development process.

Thus in preferred embodiments a positive working pattern may be obtained after patternwise exposure and development of a precursor made by the method of the present invention. The developer solubility of the composition after it has been subjected to heat during patternwise exposure is greater than the solubility of the corresponding unexposed composition. In preferred embodiments this solubility differential is increased by means of additional components and/or by resin modification, as described herein, and in our earlier patent applications which are referred to. Preferably such measures reduce the solubility of the composition, prior to the patternwise exposure. On subsequent patternwise exposure the exposed areas of the composition are rendered more soluble in the developer, than the unexposed areas. Therefore on patternwise exposure there is a change in the solubility differential of the unexposed composition and of the exposed composition. Thus in the exposed areas the composition is dissolved, to form the pattern.

The coated precursor produced by the method of the invention may in use be patternwise heated indirectly by exposure to a short duration of high intensity radiation transmitted or reflected from the background areas of a graphic original located in contact with the recording material.

The developer is dependent on the nature of the polymeric substance, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably an aqueous developer is an alkaline developer containing one or more inorganic or organic metasilicates.

In accordance with a second aspect of the present invention there is provided a precursor provided by a method as previously defined. The precursor may be a precursor for an electronic part, a mask, or, especially, a printing form.

In accordance with a third aspect of the invention there is provided a method of producing a part bearing a resist pattern from a precursor of the second aspect, comprising an exposure step to render selected areas of the composition developer soluble, followed by The following Examples more particularly serve to illustrate various embodiments of the present invention described hereinabove.

Starting Materials

The following are referred to hereinafter.

Resin A: SD 140A, a high purity cresol novolak resin made from 75% meta-cresol and 25% para-cresol, of weight average molecular weight Mw 7000 and number average molecular weight Mn 1000, and available from Borden Chemicals of Southampton, UK.

Resin B: LB6564—a phenol/cresol novolak resin marketed by Bakelite, UK, and believed to have the structure:

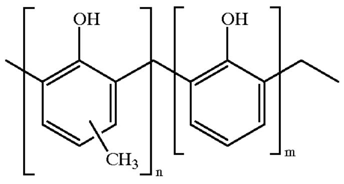

Resin C: LB 744—a cresol novolak resin marketed by Bakelite, UK, and believed to have the structure:

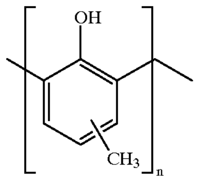

Dye A, having the CAS Registry number 134127-48-3, and believed to have the structure:

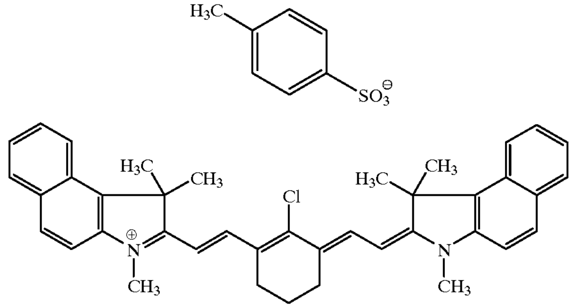

Dye B: KF 654B PINA as supplied by Riedel de Haan UK, Middlesex, UK, and believed to have the structure:

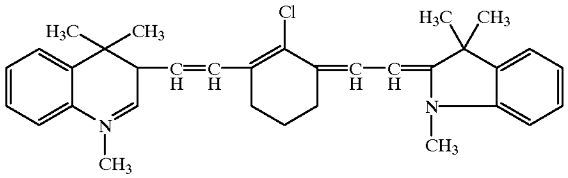

Dye C: crystal violet (basic violet 3, C.I. 42555, Gentian Violet) as supplied by Aldrich Chemical Company of Dorset, UK, and believed to have the structure:

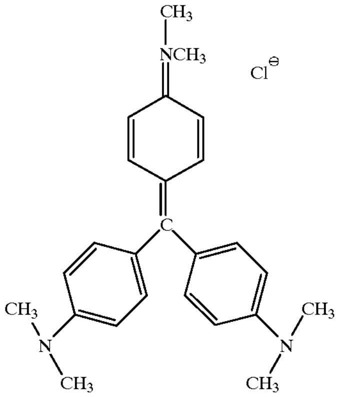

Silikophen P50X: a phenyl methyl siloxane as supplied by Tego Chemie Service GmbH of Essen, Germany.

Developer A—14% wt sodium metasilicate pentahydrate in water.

Substrate A—aluminium sheet electrograined and anodised and post-anodically treated with an aqueous solution of an inorganic phosphate.

CREO TRENDSETTER—refers to a commercially available imagesetter, the TRENDSETTER 3244, using PRO-COMM PLUS software, operating at a wavelength of 830 nm at powers of up to 10W, and supplied by Creo Products Inc. of Burnaby, Canada.

EXAMPLE 1

On Substrate A the following solution was applied via a wire-wound bar:

5.0 g Resin A 0.50 g Dye A 50 g methylethylketone 30 g methanol 14.5 g 1-methoxypropan-2-ol Substrate A with the wet coating was dried in an oven at 110° C. for 3 minutes. The oven was then switched off for the plate to cool to ambient temperature, in the oven. The plate was then exposed to IR radiation of wavelength 830 nm on the CREO TRENDSETTER at an imaging energy density of 200 $mJ/cm^2$. The imaged plate was then developed in Developer A. It was found that the laser exposed areas dissolved in 20 seconds, whereas the non-exposed area took 12 minutes to dissolve. The cooling profile of the oven used was measured and is shown in FIG. 1.

EXAMPLE 2

Example 1 was repeated except that the plate after 3 minutes drying at 110° C. was removed from the oven and left to cool to ambient temperature on a vertical rack outside the oven. The plate was then imaged and developed as described in Example 1. It was found that the laser-struck areas dissolved in 20 seconds whereas the non-exposed areas took 3 minutes to dissolve.

EXAMPLE 3

An unexposed plate prepared in Example 1, was reheated to 110° C. and cooled to ambient temperature on a vertical rack outside the oven. The plate was then imaged and developed as described in Example 1. It was found that the laser-struck areas dissolved in 20 seconds whereas the non-exposed areas took 3 minutes to dissolve.

EXAMPLES 4–7

These examples illustrate the impact of the "lower temperature" on a method in which the elevated temperature exceeds Tg of the coating composition. A plate prepared as in Example 1 was heated to 110° C. for 5 min, and then cooled down with the oven power off until the predetermined lower temperature was reached. Then the plate was moved to a vertical rack outside the oven for further cooling to ambient temperature. The time required to dissolve the unexposed coating in Developer A is summarized in Table 1 below.

TABLE 1

| Example No | Temperature when plate is taken out of the oven | Dissolution time of unexposed coating |
|---|---|---|
| 4 | 60° C. | 8 min |
| 5 | 50° C. | 12 min |
| 6 | 40° C. | 12 min |
| 7 | 25° C. | 12 min |

EXAMPLES 8–11

These examples illustrate the impact of duration held at elevated temperature when the elevated temperature is lower than Tg, prior to slow cooling in accordance with the invention. Plates prepared as in Example 1 were subjected to a temperature of 80° C. for a given hold time before cooling down in the oven to 45° C. and thereafter, to ambient temperature, outside the oven. As a comparison identical plates were subjected to a temperature of 80° C. for the same hold times, then removed from the oven and allowed to cool in ambient air from 80° C. to ambient temperature. The time required to dissolve the unexposed coating in Developer A is summarized in Table 2 below.

TABLE 2

| Example No | Time held at 80° C. | Dissolution time of unexposed coating (oven cooled) | Dissolution time of unexposed coating (not oven cooled) |
|---|---|---|---|
| 8 | 10 min | 5 min | 3 min |
| 9 | 16 hours | 9 min | 5 min |
| 10 | 24 hours | 12 min | 5.5 min |
| 11 | 40 hours | 12 min | 5.5 min |

EXAMPLE 12

The coating formulation was a solution of the components described in the table below, methoxypropan-2-ol/xylene 98:2 (v:v).

| Component | Parts by Weight |
| --- | --- |
| Resin B | 70 |
| Resin C | 20 |
| Dye B | 2 |
| Dye C | 2 |
| Silikophen P50X | 6 |

Sample plates were prepared by coating the formulation onto Substrate A by means of a wire wound bar. The formulation concentration was selected to provide a dry film having a coating weight of 2.0 $gm^{-2}$. The film weights were measured after thorough drying at 100° C. for 3 minutes in a Mathis type LTE labdryer oven (as supplied by Werner Mathis AG, Germany). After this drying step, the plates were promptly removed from the oven and allowed to cool naturally to ambient temperature, in ambient air. Next, some of the individual plates were reheated in the same labdryer oven for 3 minutes at 110° C., the oven switched off and the plates allowed to cool within the oven to ambient temperature (in the Mathis labdryer oven, individual plates took 4 hours each to reach 40° C.). All the plates were then imaged using the CREO TRENDSETTER at 10W, with a drum speed of 131 rpm, to give an imaging energy density of 200 $mJcm^{-2}$, with a plot of 0, 2, 5, 10, 20, 30, 40, 50, 60, 70, 80, 90 and 95% dot densities. The plates were developed using a Kodak Polychrome Graphics Mercury Mark V plate processor containing Developer A at 22° C., at processing speeds of 500, 750 and 1500 mm $min^{-1}$. Images produced in this manner were read using a Gretag D19C plate densitometer as supplied by Colour Data Systems Ltd., of the Wirral, UK.

Densitometer readings of the imaged dot densities are provided in the following tables for plates that had been re-heated and then slowly cooled down.

| | Processing speed/mm $min^{-1}$ | | |
| --- | --- | --- | --- |
| First experiment | 500 | 750 | 1500 |
| 2 | 1 | 1 | 3 |
| 5 | 2 | 3 | 6 |
| 10 | 6 | 8 | 11 |
| 20 | 15 | 18 | 21 |
| 30 | 27 | 29 | 31 |
| 40 | 39 | 39 | 43 |
| 50 | 49 | 51 | 53 |
| 60 | 60 | 62 | 64 |
| 70 | 70 | 74 | 75 |
| 80 | 81 | 84 | 84 |
| 90 | 92 | 93 | 93 |
| 95 | 96 | 97 | 97 |

-continued

| | Processing speed/mm $min^{-1}$ | | |
| --- | --- | --- | --- |
| Repeat experiment | 500 | 750 | 1500 |
| 2 | 0 | 1 | 2 |
| 5 | 2 | 3 | 5 |
| 10 | 6 | 8 | 11 |
| 20 | 16 | 17 | 21 |
| 30 | 27 | 29 | 31 |
| 40 | 38 | 39 | 42 |
| 50 | 49 | 50 | 53 |
| 60 | 60 | 62 | 64 |
| 70 | 71 | 74 | 75 |
| 80 | 81 | 84 | 84 |
| 90 | 91 | 93 | 93 |
| 95 | 96 | 97 | 97 |

The coating on plates which did not receive the reheating and cooling step completely dissolved away in Developer A.

The specification refers in various places to UV, infra-red and visible radiation. A person skilled in the art will be aware of the typical wavelength ranges of these radiations. However, for the avoidance of any doubt, UV radiation typically has a wavelength range not exceeding about 450 nm (by which we mean insubstantial above 450 nm). Visible radiation has a wavelength range of about 400 to 700 nm. Infra-red radiation typically has a wavelength range in excess of 600 nm, the boundaries between UV and visible radiation, and between infra-red and visible radiation, not being sharp ones.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiments. The invention extends to any of the features disclosed in this specification (including any accompanying claims, abstract and drawings), or to any of the steps of any method or process so disclosed, or combinations thereof.

We claim:

1. A method of providing a precursor which comprises an imagable coating on a substrate, the coating comprising a positive working polymeric composition, wherein the method includes a heat treatment step comprising the controlled slow cooling of the coated substrate from an elevated temperature to a lower temperature.

2. The method as claimed in claim 1, wherein the polymeric composition includes a polymer having hydroxyl groups.

3. The method as claimed in claim 2, wherein the polymeric composition includes a polymer selected from a phenolic resin and a poly(hydroxystyrene) resin.

4. The method as claimed in claim 3, wherein the polymeric composition includes a novolak resin.

5. The method as claimed in claim 4, wherein the cooling period is at least 1 hour.

6. The method as claimed in claim 4, wherein the elevated temperature is 40° C. or above.

7. The method as claimed in claim 6, wherein the elevated temperature is 50° C. or above.

8. The method as claimed in claim 1, wherein the elevated temperature is equal to or greater than the glass transition temperature of the composition and the method is applied to an individual precursor or to a spaced-apart array of precursors.

9. The method as claimed in claim 1, wherein the elevated temperature is below the glass transition temperature of the composition.

10. The method as claimed in claim 9, wherein the method is applied to a precursor coil or to a stack of precursors.

11. The method as claimed in claim 1, wherein the precursor is held at the elevated temperature for an extended period, prior to the slow cooling.

12. The method as claimed in claim 1, wherein the method comprises the application of the composition in liquid form to the substrate and the drying of the composition, the precursor subsequently being heated to said elevated temperature.

13. The method as claimed in claim 1, wherein the controlled slow cooling is effected in an oven.

14. The method as claimed in claim 1, wherein the heat treatment is such as to increase the time required to dissolve the non-imaged composition in a developer by at least 50%.

15. The method as claimed in claim 14, wherein the increase in time is at least 200%.

16. The method as claimed in claim 1, wherein the cooling rate is sufficiently slow that the solubility of the non-imaged composition in a developer is at or near its minimum achievable by the method.

17. The method as claimed in claim 1, wherein the composition is such that its solubility in a developer is not increased by incident UV radiation.

18. The method as claimed in claim 1, wherein said composition is such that it may be patternwise imaged by direct heat; or by charged particle radiation or electromagnetic radiation, in the latter cases said radiation being converted to heat by the coating.

19. The method as claimed in claim 18, wherein the composition comprises a radiation-absorbing compound able to absorb electromagnetic radiation entirely or predominantly in the range 600 to 1400 nm and convert it to heat.

20. The method as claimed in claim 19, wherein the composition contains 0.25–25% wt of said radiation-absorbing compound.

21. The method as claimed in claim 1 wherein the composition comprises, as an additional component, a compound which acts to reduce the developer solubility of the composition, wherein the developer solubility of the composition is increased on heating but not increased by incident UV radiation.

22. The method as claimed in claim 1, wherein the composition comprises 0.1–10% of a siloxane, by weight of the composition.

23. A method as claimed in claim 1, for providing a printing form precursor.

24. A positive working lithographic printing form precursor produced by a method as claimed in claim 23.

25. A method as claimed in claim 1, for providing an electronic part precursor.

26. A positive working electronic part precursor as claimed in claim 25.

27. A method of producing an imaged article, comprising an imagewise exposure step of effecting heating of selected areas of the composition of a precursor prepared by the method of claim 1, such as to render such areas soluble in an aqueous developer, followed by development in said aqueous developer to remove said selected areas.

28. A lithographic printing form produced by a method as claimed in claim 27.

29. An electronic part produced by a method as claimed in claim 28.

30. A method of providing a precursor which comprises an imagable coating on a substrate, the coating comprising a positive working polymeric composition which includes a novolak composition, wherein the method includes a heat treatment step comprising the controlled slow cooling of the coated substrate from an elevated temperature to a lower temperature, and the mean cooling rate of any region of the precursor during the interval between the elevated temperature and the lower temperature is not greater than 1° C./min.

31. A method of providing a precursor which comprises an imagable coating on a substrate, the coating comprising a positive working polymeric composition, wherein the method includes a heat treatment step comprising the controlled slow cooling of the coated substrate from an elevated temperature to a lower temperature, and thermally insulating material is applied about the precursor, to achieve or assist said slow controlled cooling.

* * * * *

UNITED STATES PATENT AND TRADEMARK OFFICE
CERTIFICATE OF CORRECTION

PATENT NO. : 6,251,559 B1
DATED : June 26, 2001
INVENTOR(S) : Huang et al.

It is certified that error appears in the above-identified patent and that said Letters Patent is hereby corrected as shown below:

Title page,
Item [56], References Cited, FOREIGN PATENT DOCUMENTS,
"9921715 5/1999 (WO)" should be deleted Item [57], ABSTRACT,
Line 2, "coating" should read -- coated --

Column 5,
Line 19, "dialkylmaleiimide" should read -- dialkylmaleimide --

Column 6,
Line 19 "al" should read -- al- --
Line 33, "air The" should read -- air. The --
Line 39, "usefull" should read -- useful --

Column 7,
Line 7, "full" should read -- ful --
Line 33, "d" should read -- drying --
Line 40, "pattern wise" should read -- patternwise --

Column 9,
Line 41, "quatem-" should read -- quatern- --
Line 44, "quartemized" should read -- quaternized --
Line 46, "WO 97/01796" should read -- WO 99/01796 --

Column 11,
Line 18, "terephthlate" should read -- terephthalate --

UNITED STATES PATENT AND TRADEMARK OFFICE

CERTIFICATE OF CORRECTION

PATENT NO. : 6,251,559 B1
DATED : June 26, 2001
INVENTOR(S) : Huang et al.

It is certified that error appears in the above-identified patent and that said Letters Patent is hereby corrected as shown below:

Column 17,
Line 33, "heat;" should read -- heat, --
Line 39, "range 600" should read -- range of 600 --

Signed and Sealed this

Thirtieth Day of April, 2002

*Attest:*

JAMES E. ROGAN
*Director of the United States Patent and Trademark Office*

*Attesting Officer*